(12) United States Patent
Chang et al.

(10) Patent No.: US 9,297,861 B2
(45) Date of Patent: Mar. 29, 2016

(54) STATE OF HEALTH DETERMINATION WITHOUT UNNOTICED BATTERY SHUT DOWN

(71) Applicant: Changs Ascending Enterprise Co., LTd., Taichung (TW)

(72) Inventors: Chun Chieh Chang, Ithaca, NY (US); Tsun Yu Chang, Taichung (TW)

(73) Assignee: CHANGS ASCENDING ENTERPRISE CO., LTD., Taichung (TW)

( * ) Notice: Subject to any disclaimer, the term of this patent is extended or adjusted under 35 U.S.C. 154(b) by 118 days.

(21) Appl. No.: 13/687,219

(22) Filed: Nov. 28, 2012

(65) Prior Publication Data
US 2014/0145853 A1 May 29, 2014

(51) Int. Cl.
G08B 21/00 (2006.01)
G01R 31/36 (2006.01)
G01R 19/165 (2006.01)

(52) U.S. Cl.
CPC ...... *G01R 31/3658* (2013.01); *G01R 19/16542* (2013.01); *G01R 31/362* (2013.01); *G01R 31/3679* (2013.01)

(58) Field of Classification Search
CPC ... G08B 7/06; B60L 11/1864; G01R 31/3658
USPC .................................................. 340/636.15
See application file for complete search history.

(56) References Cited

U.S. PATENT DOCUMENTS

| | | | | |
|---|---|---|---|---|
| 5,493,197 A | * | 2/1996 | Eguchi et al. | 320/116 |
| 6,417,646 B1 | * | 7/2002 | Huykman et al. | 320/122 |
| 7,199,489 B2 | * | 4/2007 | Gottlieb et al. | 307/66 |
| 7,394,394 B2 | * | 7/2008 | Lockhart et al. | 340/636.11 |
| 7,474,228 B2 | * | 1/2009 | Lockhart et al. | 340/636.1 |
| 8,547,065 B2 | * | 10/2013 | Trigiani | 320/119 |
| 8,571,738 B1 | * | 10/2013 | Potter et al. | 701/22 |
| 8,635,038 B2 | * | 1/2014 | Benjamin et al. | 702/63 |
| 2004/0212941 A1 | * | 10/2004 | Haas et al. | 361/90 |
| 2005/0038614 A1 | * | 2/2005 | Botts et al. | 702/63 |
| 2010/0010769 A1 | * | 1/2010 | Houldsworth | 702/130 |
| 2012/0013180 A1 | * | 1/2012 | Muto et al. | 307/9.1 |
| 2012/0274281 A1 | | 11/2012 | Kim | |
| 2013/0009648 A1 | * | 1/2013 | Tae | 324/503 |
| 2014/0068310 A1 | * | 3/2014 | Sultenfuss et al. | 713/340 |

FOREIGN PATENT DOCUMENTS

| | | |
|---|---|---|
| CN | 101078750 A | 11/2007 |
| CN | 101499676 A | 8/2009 |
| TW | 201240276 A | 10/2012 |

OTHER PUBLICATIONS

International Search Report and Written Opinion for PCT/IB2014/001216 (mailed Nov. 28, 2014).

* cited by examiner

*Primary Examiner* — Eric Blount
(74) *Attorney, Agent, or Firm* — McClure, Qualey & Rodack, LLP

(57) ABSTRACT

In one embodiment, a battery control system, comprising: a plurality of battery units comprising a battery system; and a controller coupled to the plurality of battery units, the controller configured to monitor, for each battery unit, a first voltage and a second voltage, the first voltage corresponding to an absolute value of a shut-off voltage and a second voltage corresponding to a warning voltage, the first voltage smaller than the second voltage, wherein responsive to one of the battery units reaching the second voltage, the controller is configured to provide a first alert before the any of the battery units reaches the first voltage.

16 Claims, 5 Drawing Sheets

STATE OF HEALTH DETERMINATION WITHOUT UNNOTICED BATTERY SHUT DOWN

TECHNICAL FIELD

The present disclosure is generally related to the determination of state of health of the battery while preventing unnoticed battery shut down.

BACKGROUND

State of health determination for batteries is important for electric bikes, electric motorcycles, electric vehicles, electric forklifts, and energy storage systems that require a wide range and a dynamic battery energy as the power source. The absence of a proper mechanism in the determination of the state of health of the batteries may result in unnoticed shut down (or failure) of a battery system during service. In general, the unnoticed shut down (or failure) of the battery system is caused by one of the batteries (or battery sets) connected in series that possesses a smaller capacity or higher resistance. This problem is especially severe for lithium ion battery systems since an absolute cut-off voltage is usually set for each battery (or battery set) connected in series. One scenario that may lead to unnoticed shut down of the battery system is when one of the batteries (or battery sets) connected in series reaches a cut-off condition before the battery system's working lower-cut-off voltage is reached. In this case, a battery system shut down may result without notice.

On the other hand, the determination of state of health may not be easily conducted without complicated and prolonged processes. For example, probing individual battery or battery set capacity separately involves cycling each battery. This is a long and complicated process that cannot be conducted on a daily basis, and hence increases the risk of unnoticed shut down of the battery system during users' daily operation.

SUMMARY

In one embodiment, a battery control system, comprising: a plurality of battery units comprising a battery system; and a controller coupled to the plurality of battery units, the controller configured to monitor, for each battery unit, a first voltage and a second voltage, the first voltage corresponding to an absolute value of a shut-off voltage and a second voltage corresponding to a warning voltage, the first voltage smaller than the second voltage, wherein responsive to one of the battery units reaching the second voltage, the controller is configured to provide a first alert before the any of the battery units reaches the first voltage.

BRIEF DESCRIPTION OF THE DRAWINGS

Many aspects of the systems and methods of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1A:
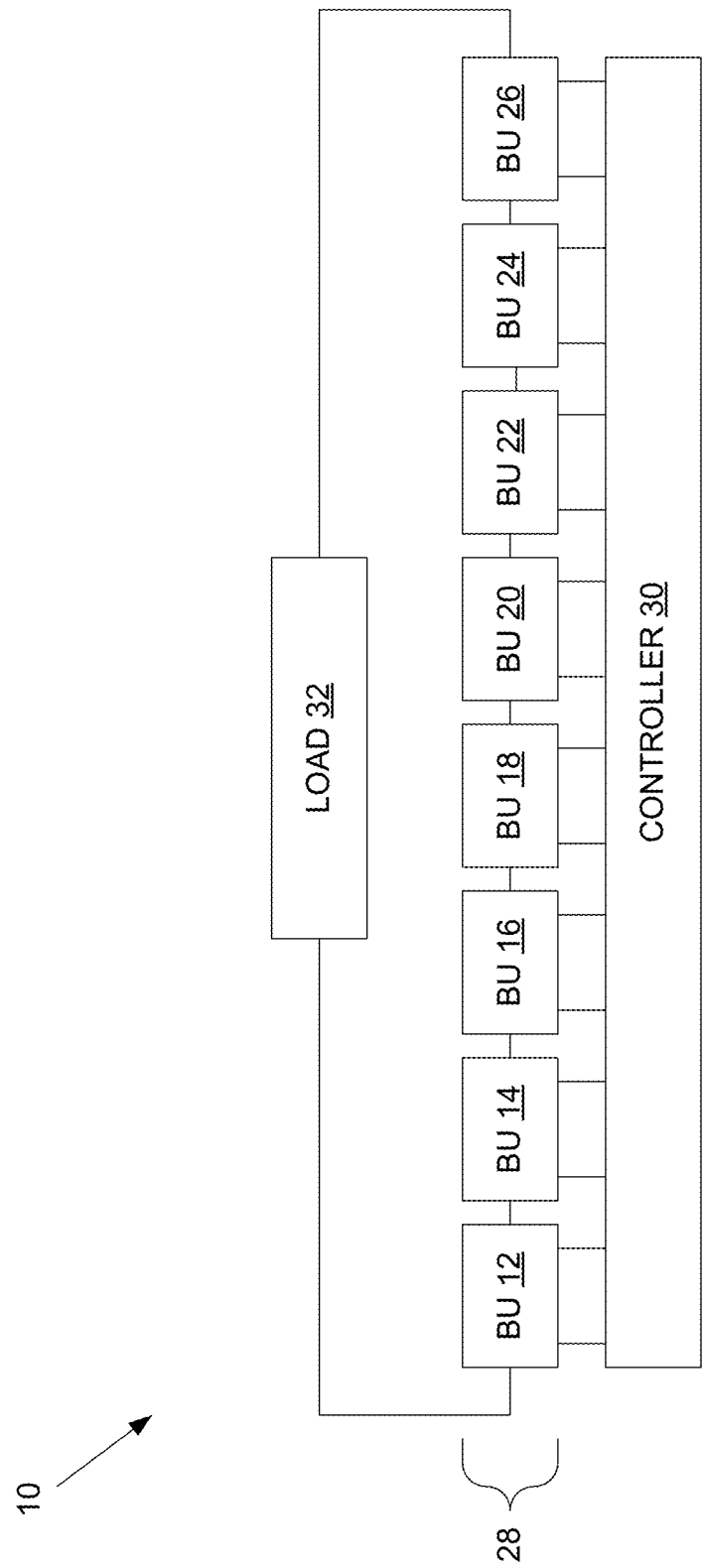
FIG. 1A is a block diagram that illustrates an example battery system that implements an embodiment of a battery control system.

Disclosed herein are certain embodiments of an invention involving a battery control system and method that enable battery state of health determinations while preventing unnoticed battery shut down. In one embodiment, the battery control system comprises one or more controllers that monitor plural voltages of each battery of a battery system, including the absolute cut-off voltage and a warning voltage, and alert a user of an impending shutdown in the battery system. In other words, certain embodiments of battery control systems alert a user (or device in some embodiments, such as where automated control is desired) to take certain actions responsive to one or more of the batteries reaching the warning voltage, hence avoiding or preventing the one or more batteries from reaching the absolute cut-off voltage. In some embodiments, a battery control system also provides a state of health determination, as described further below.

Digressing briefly, conventional systems often operate in a manner where system shutdown is unnoticed, as previously described. Aside from unnoticed shut down of the battery system, the identification of the state of health of the battery or batteries (or battery sets) connected in series that possesses a shorter capacity is also important. For example, assume an electric motorcycle that usually travels 50 miles per charge. If the mileage is shorter than expected, alerting a user to this condition is important in preventing sudden unnoticed battery shut down, as a first priority, while notifying the user whether the battery system is in a healthy state. Providing this information on the lower charge capacity and state of health of the battery (or battery sets) enables the user to avoid the unnoticed shut down risk, and at the same time, urge the user conduct proper activities such as getting battery maintenance. In certain embodiments of the present disclosure, a simple and viable method as well as apparatus (and system) are introduced for battery state of health monitoring that may be conducted on a daily (regular) basis without the occurrence of unnoticed battery shut down.

Having summarized certain features of battery control systems of the present disclosure, reference will now be made in detail to the description of the disclosure as illustrated in the drawings. While the disclosure will be described in connection with these drawings, there is no intent to limit it to the embodiment or embodiments disclosed herein. Further, although the description identifies or describes specifics of one or more embodiments, such specifics are not necessarily part of every embodiment, nor are all of any various stated advantages necessarily associated with a single embodiment. On the contrary, the intent is to cover all alternatives, modifications and equivalents included within the spirit and scope of the disclosure as defined by the appended claims. Further, it should be appreciated in the context of the present disclosure that the claims are not necessarily limited to the particular embodiments set out in the description.

Note that reference herein to a battery refers to a single battery cell, and that reference herein to a battery cell set (or battery set) refers to several batteries cells in parallel. To facilitate an understanding of the description below, a battery unit as used herein contemplates either a battery cell or a battery cell set. Further, it is noted that reference herein to a module refers to battery cells being connected in series and/or parallel (e.g. a 13.3V 40 Ah lithium iron battery comprises a module that consists of four battery cell sets in series, each set consists of four 10 Ah battery cells in parallel). A battery system as used herein refers to battery modules being connected in series and parallel. All terminologies mentioned above will be used throughout the present disclosure.

Referring now to FIG. 1A, shown is a block diagram that illustrates an example battery system 10 that implements an embodiment of a battery control system. One having ordinary skill in the art should appreciate in the context of the present disclosure that the battery system 10 depicted in FIGS. 1A (and 1B) is merely illustrative, and that other battery systems with a different arrangements of components may be used and may incorporate certain embodiments of a battery control system. The battery system 10 comprises a plurality of battery units, including battery units 12-26, arranged in series, as depicted in FIG. 1A. The plurality of battery units 12-26 may generally be denoted with reference numeral 28. To facilitate an understanding of the various embodiments of a battery control system, it is assumed that the battery units 28 are embodied as battery cells, with the understanding that the battery units 28 may be embodied as battery sets in some implementations. Further, the plurality of battery units 28 collectively define a single module in this example. The battery system 10 further comprises a controller 30 coupled to each of the plurality of battery units 28. The plurality of battery units 28 are also coupled, in series, to a load 32. In one embodiment, the battery control system comprises the controller 30 and the plurality of battery units 28, though some embodiments may include fewer or additional components. In some embodiments, the module and the controller 30 may be packed in the same integrated device, and in some embodiments, the module and controller may be coupled yet separate.

In the depicted embodiment in FIG. 1A, the controller 30 is utilized in monitoring the voltages of each battery unit 12-26 connected in series. For each battery unit 12-26, two voltages are monitored: the first voltage is the absolute cut-off voltage, and the second voltage is a warning voltage that is higher than the first voltage. Note that for battery units configured as battery sets, monitoring of the set need only be performed given the parallel arrangement of a battery set. Meanwhile, the overall voltage for all the battery units 28 connected in series is also monitored as a system voltage. Using a vehicle as an example environment where the battery system 10 may be used, with the understanding that other environments may use the battery system 10, during the discharge of the battery system 10, if the second voltage is reached, a first alert (e.g., signal) is sent to a user or vehicle through mechanisms such as a buzzer, lighting, or any analog or digital mechanisms. At this moment, the user or vehicle should decrease the load 32 (such as decrease the speed or the motor rpm) for preventing the first alert from being generated continuously. If the load reduction does not prevent the first alert from being generated continuously, this condition is referred to as an "end" of discharge. At this moment, the system voltage (e.g., monitored at the battery module) may be used in determining the state of health of the battery units 28 connected in series. If the voltage is still higher than the system voltage, meaning the system voltage is not yet reached (e.g., usually the system voltage is higher than the multiplication of the second voltage times the number of the battery units 28 connected in series), that means one of the battery units 28 connected in series is shorter in capacity, which forces the battery system 10 to end its working cycle. Under such circumstance, a second alert showing (or representing) "maintenance required" is generated and sent to the user or vehicle by any mechanism, such as a different sound in buzzing, lighting, or any analog or digital forms. In contrast to the above situation, if the system voltage is reached before the continuous first alert, or if the system voltage is reached and passed (i.e., below system voltage) when the first alert is continuous, then no "maintenance required" alerts are generated.

Figure 1B:
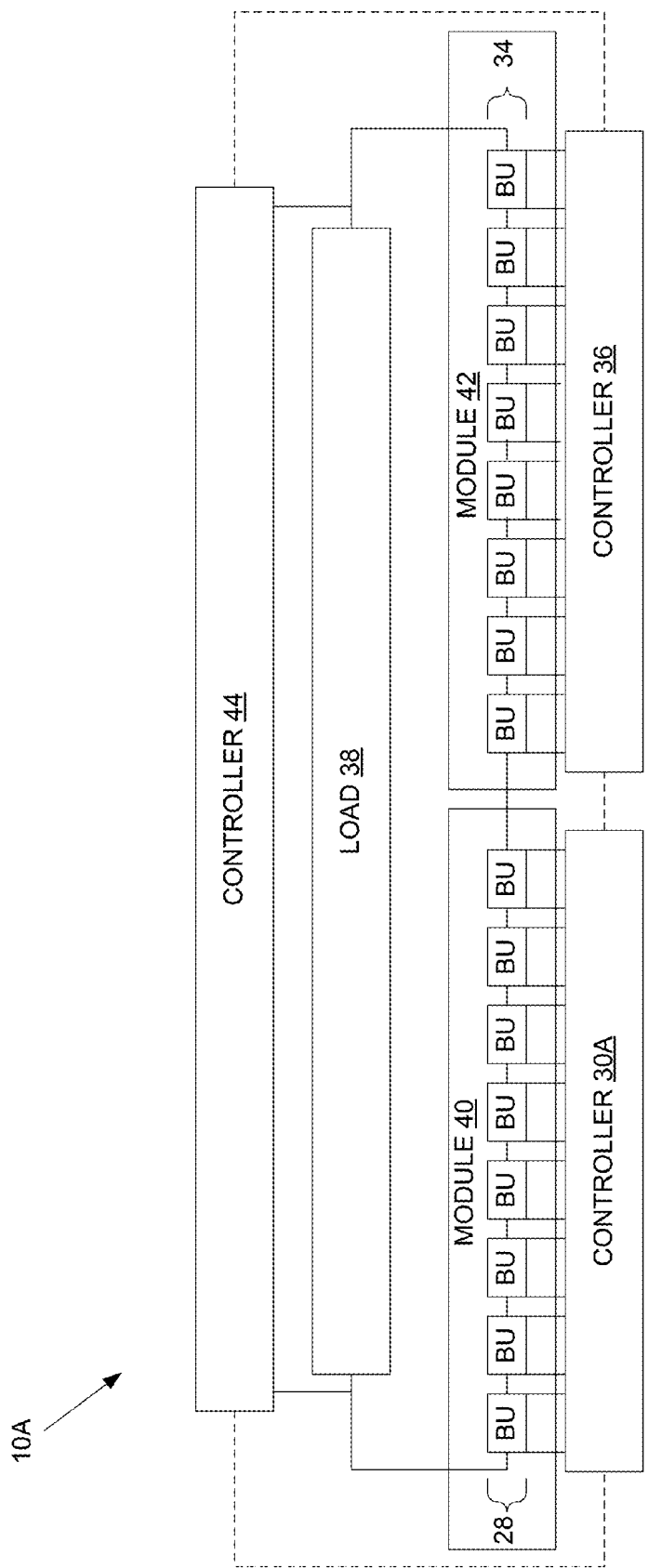
FIG. 1B is a block diagram that illustrates another example battery system that implements an embodiment of a battery control system.

FIG. 1B is a block diagram that illustrates another example battery system 10A that implements an embodiment of a battery control system. Once again assuming a single battery cell for each battery unit, with the understanding that the battery unit may also be a battery cell set in some embodiments, the example battery system 10A comprises, in part, similar features as shown in FIG. 1A. For instance, the plurality of battery units 28 are shown connected together in series, with each battery unit 28 monitored by a controller 30A for detecting the first and second voltages. Also shown in FIG. 1B is another plurality of battery units 34 arranged in series, with each battery unit 34 monitored by a controller 36 for the first and second voltages. The plurality of battery units 28 and 34 are coupled together in series, with each also coupled to a load 38. The plurality of battery units 28 comprise a module 40, and the plurality of battery units 34 comprise another module 42. In some embodiments, the module 40 and the controller 30A (and module 42 and controller 36) may be packaged in the same integrated device. In some embodiments, the module 40 and the controller 30A may be packaged in one integrated device, and the module 42 and controller 36 may be packaged in the same integrated device that is different than the integrated device comprising the module 40 and controller 30A. In some embodiments, the modules and controllers may be coupled yet separate devices. Unlike the controller 30 in the first example in FIG. 1A, the controllers 30A and 36 in FIG. 1B are not configured to monitor the state of the health and system voltages. Note that in some embodiments, the controllers 30A and 36 may be configured to monitor the state of the health and system voltages, yet not operate in that manner (e.g., functionality deactivated or disabled). Controller 44 is included in the example battery system 10A and configured to monitor the load 38 and hence the system voltage and provide state of health determinations (e.g., capacity shortage problems). The controllers 30A, 36, and 44 communicate (e.g., via a wired or wireless medium) with one another (e.g., as depicted with a dashed line) to provide the function of alerting a user or device (e.g., vehicle) of when the warning voltage has been reached by one or more of the battery units 28 and 34, and to do so before reaching the cut-off voltage, which if occurred, may result in an unnoticed shut-down or failure. In other words, using the battery control system, as described for FIGS. 1A-1B, the first voltage will not be reached unexpectedly. The battery unit capacity information (e.g., capacity or capacity information, unlike capacity used in the background portion of the disclosure, refers to the knowledge or indicator of a shortage in capacity) between the second voltage and the first voltage enables the user or device to conduct proper activities before the battery system 10 (or 10A) shuts down. For instance, in the case of a series hybrid electric vehicle, the generator (usually powered by an internal combustion engine) may be triggered before the battery system 10 or 10A shuts down.

Note that the controllers 30, 30A, and 36 are used to monitor (e.g., detect) the first and second voltages for each battery unit of the plurality of battery units 28 and 34, respectively, and the controller 44 (and 30) is used to monitor the system voltage and provide state of health determination of each of the plurality of battery units 28 and 34 connected in series. In some embodiments, the controllers 30A and 36 may be configured to monitor the module voltages for comparison with the system voltage monitored by the controller 44. In some embodiments, the controller 44 may be coupled to, or integrated with, one or more modules of battery units, where the battery control system may be implemented in each battery module by monitoring voltages of each battery unit (e.g., battery cell or set) and comparing with the battery system voltage that contains several such battery modules (or in some embodiments, the controller 44 does not contain one or more battery modules).

In one embodiment, the controllers 30, 30A, 36, and 44 (and one or more battery unit modules in some embodiments) may all be integrated in a single integrated device, such as an integrated circuit (IC), a microcontroller unit (MCU), or a programmable logic controller (PLC), among other packaged units. In some embodiments, each controller 30, 30A, 36, and 44 may be discrete and separate packaged units. In other words, the overall voltage detection and determination of the state of health (e.g., such as performed by controller 44) may be implemented by a separate IC, MCU, or PLC (i.e., separate from the controllers 30A and 36). Any device or system that is utilized in preventing unnoticed battery shuts down and state of health determination through battery cell voltage monitoring and overall battery system voltage monitoring is contemplated to be within the scope of the present disclosure.

Several observations may be made in view of the above description, including the following: (a) during the above-described battery control process, a battery state of health may be monitored and diagnosed during daily operation; (b) the battery control system and method described above may be implemented locally in each battery module, avoiding the need for complicated sensors, data transmissions, and/or extensive calculations for monitoring battery state of charge; (c) the simplicity of the battery control systems described herein enable the vehicle (or device) electronic control unit (ECU) to work more reliably and efficiently than conventional systems. For instance, in some embodiments, the only data to transmit may be exclusively either a "slow down" (e.g., associated with the first alert) or "maintenance required" (e.g., associated with the second alert); and (d) the battery control systems utilize only voltage detections and may achieve both "prevention of unnoticed battery system shut down" and "state of health determination." In general, certain embodiments of the battery control systems are simple and reliable, and may be applicable in any applications that require wide and dynamic power sources.

As should be appreciated in the context of the present disclosure, certain embodiments of battery control systems and methods may be implemented in each battery module that monitors each battery unit (e.g., battery cell or set) and compares with the module voltage, or may be implemented in a battery system comprising a battery control system that monitors each battery module voltage and compares with the battery system voltage. In some embodiments, the battery control systems and methods may be implemented in each battery module by monitoring voltages of each battery unit (e.g., battery cell or set) and compares with the battery system voltage that contains several such battery modules.

Figure 2:
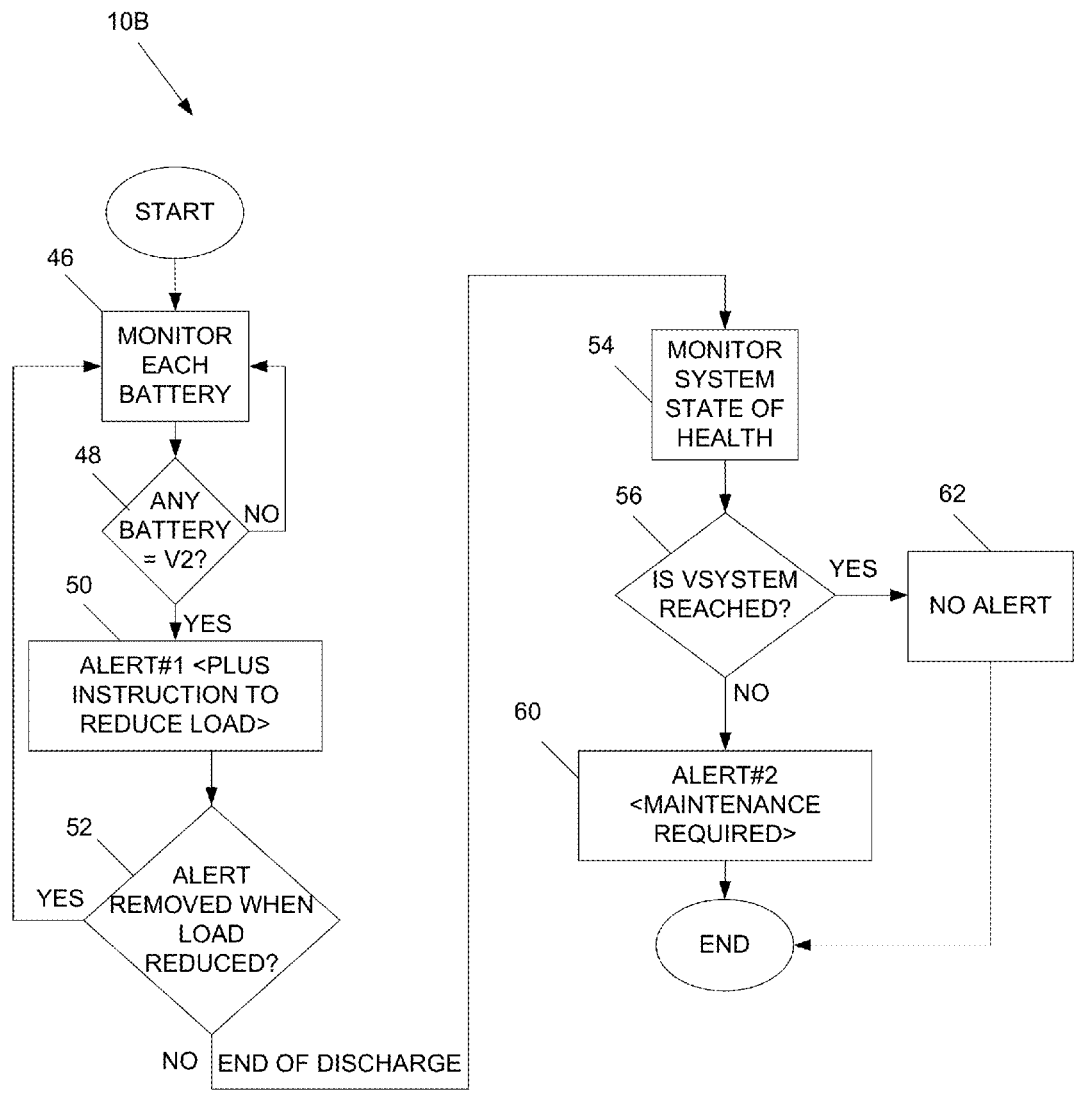
FIG. 2 is a flow diagram that illustrates one embodiment of a battery control method.

In view of the above description, it should be appreciated that one battery control method 10B, as depicted in FIG. 2 and implemented by one or more controllers, comprises monitoring each battery unit (e.g., battery cell or battery set) among a plurality of battery units (46), and determining whether any of the plurality battery units comprises a voltage that reaches the associated warning voltage (48). If not, the monitoring continues (e.g., return to monitoring (46). If any of the plurality of battery units does equal the warning voltage ("Yes"), then a first alert (alert#1) is provided (50), which may include or be associated with an instruction to reduce the load (e.g., reduce speed or RPM of a vehicle). The battery control method 10B further determines whether the first alert has been removed in response to reducing the load (52), and if so, processing returns to the monitoring (46), and if not, the condition corresponds to an end of discharge and processing continues to monitoring overall system health (54). A determination is made by the control method 10B whether the system voltage has been reached (56). For instance, as described previously, the process (56) involves determining if the voltage has fallen to, or below, the system voltage. If so, the battery control method 10B abstains or refrains from sending an alert (62), otherwise, a second alert (e.g., alert #2) is provided (60). In other words, if the system voltage is reached before the continuous first alert, or if the system voltage is reached and passed (i.e., below system voltage) when the first alert is continuous, then no "maintenance required" alerts are generated. Note that the alert, when issued, may accompany, or include, a message that maintenance is required.

Figure 3:
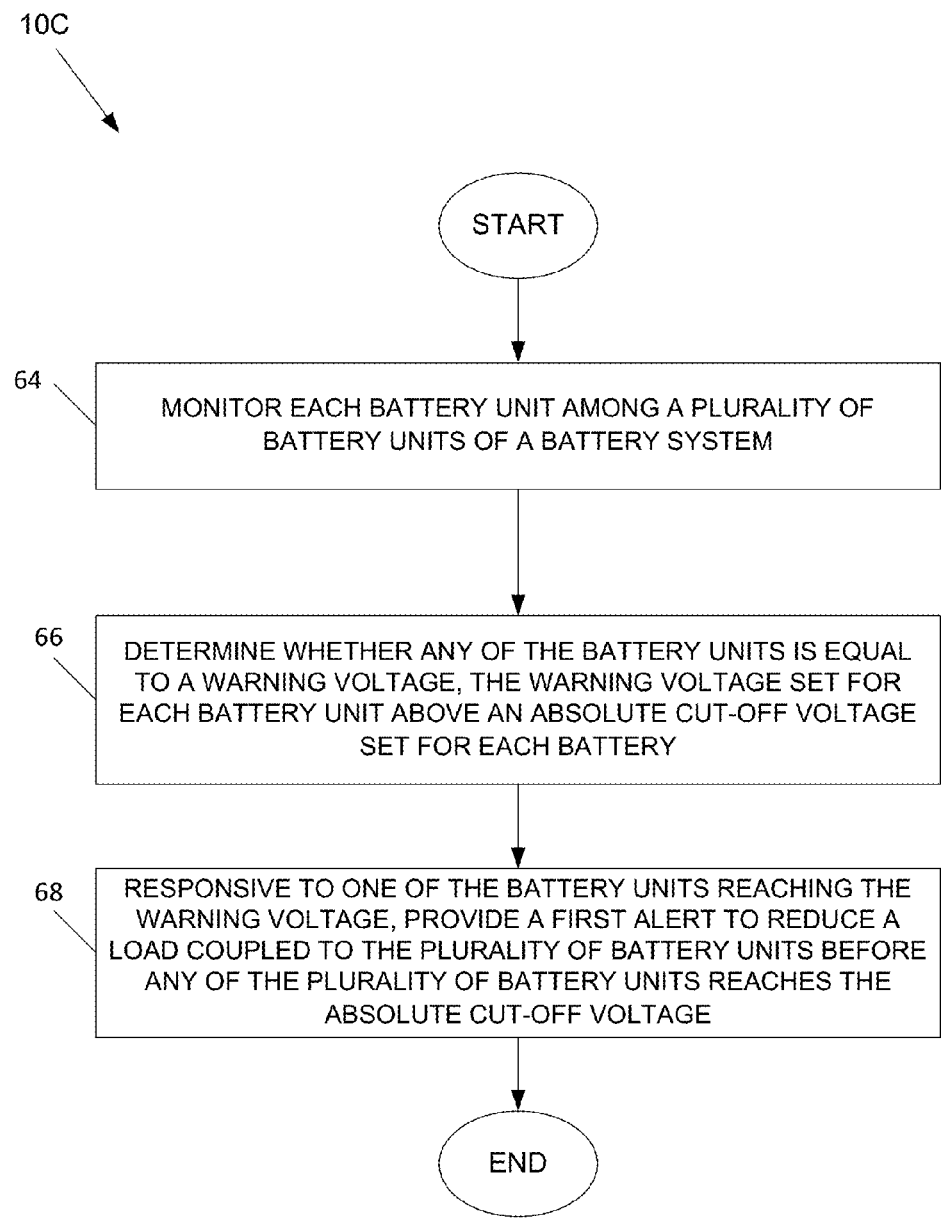
FIG. 3 is a flow diagram that illustrates another embodiment of a battery control method.

Another method embodiment, denoted battery control method 10C and shown in FIG. 3, comprises, in a controller, monitoring each battery unit among a plurality of battery units of a battery system (64), determining whether any of the battery units is equal to a warning voltage, the warning voltage set for each battery unit above an absolute cut-off voltage set for each battery (66); and responsive to one of the battery units reaching the warning voltage, providing a first alert to reduce a load coupled to the plurality of battery units before any of the plurality of battery units reaches the absolute cut-off voltage (68).

Figure 4:
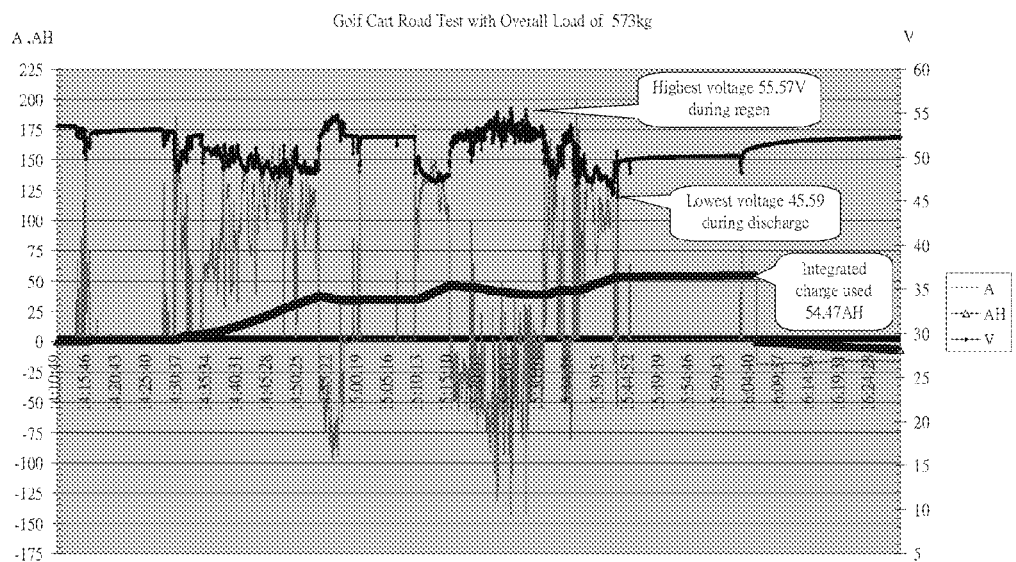
FIG. 4 is a plot diagram that illustrates one example of a battery control method utilized in an electric golf cart.

A few examples may help to illustrate some example operations using battery control systems as disclosed herein. It should be appreciated that the values used in these examples are merely illustrative, and that other values may be achieved depending on the circumstances. In one example, referred to as Example I, assume a battery system implemented in a golf cart, the golf cart equipped with two modules in series. Each module contains eight (8) battery units embodied as battery cell sets in series, and each battery cell set contains eight 8 Ah batteries arranged in parallel. Lithium iron batteries are used in the present example. As should be appreciated by one having ordinary skill in the art, lithium iron batteries refer to those using $LiFePO_4$ or the non-stoichiometric form of $LiFePO_4$ as the cathode material, as disclosed in, for instance, U.S. Pat. No. 7,494,744(B2), U.S. Pat. No. 7,585,593(B2), U.S. Pat. No. 7,629,084(B2), and U.S. Pat. No. 7,718,320(B2). In each battery module, a controller is used to monitor the eight battery cell sets connected in series. The second voltage (e.g., warning voltage) is set to be 2.8V and the first voltage (cut-off voltage) is set to 2.0V for each battery set. The system voltage is monitored and is set to be 48V in the present case. FIG. 4 shows the results of the test run that continues for a distance of 22 km (equivalent to 13.8 miles).

As noted from FIG. 4, the continuous buzzing sound observed during the test run was around the point marked "Lowest voltage 45.59 during discharge". At this moment, since 45.59V is lower than the preset system voltage 48V, no "maintenance required" alert (e.g., signal) is generated. This means the battery units are substantially the same in capacity, thus the overall voltage is less than the preset system voltage 48V. In other words, the voltage reading 45.59 is reached because one of the battery cells had reached 2.8V and the rest of the battery cell sets contribute (45.59−2.8)=42.79V. If an average is taken of 42.79 with the remaining 15 battery sets, each battery set contributes 2.85V, which is very close to the one that triggered 2.8V alarm. If one of the cell set reaches 2.8V when system voltage is at 50V (higher than the system preset voltage 48V), then an average of (50−2.8)=47.2V for the remaining 15 battery sets is obtained as 47.2/15=3.15V, which is very different from the 2.8V thus "maintenance required" should be generated. It is noteworthy that the system voltage alone may not reflect the real individual battery voltage. It is more reliable to use individual battery voltage (the second voltage) as the basis for the first alarm and use the system voltage as a checkup for the battery health status.

As another example, referred to as Example 2 and described in the context of an electric vehicle, a TOYOTA® COMS electric vehicle is used for demonstration. The battery system implemented in the COMS consists of three modules in series. Each module contains 8 battery units configured as sets in series and each battery set contains five 10 Ah batteries in parallel. Lithium iron batteries are again used in the present case. In each battery module, a controller is used in monitoring the eight battery sets connected in series. The second voltage is set to be 2.8V and the first voltage (cut-off voltage) is set to 2.0V for each battery set. The system voltage is monitored and is set to be 72V in the present case. After 64.7 km of driving, the buzzer starts to sound. At this instance, the driving speed is decreased to 20 km/hr and no sound is generated. After further 4 km of driving, the vehicle starts to sound continuously. No "maintenance required" signal is generated at this time and the battery module voltages were measured to be 21.3V, 24.16V, and 23.72V, which is lower than 72V preset system voltage.

It is believed that the same technique may be used for monitoring the three module voltages and comparing with the system voltage. If one of the modules exhibits a lower voltage (e.g. 20V) and generates an alarm, and the overall voltage is higher than 72V (e.g. 75V), a significant imbalance between modules may be identified because the other two modules should have an average voltage of (75−20)/2=27.5V, and thus a "maintenance required" alert (e.g., signal) should be generated to attract the user's attention.

In yet another example, referred to herein as Example III, an uninterrupted power supply (UPS) is used as an example environment for an embodiment of a battery control system. In this example, a 3 kW UPS is used for demonstration. The battery system implemented in the UPS consists of only one module. The module contains 16 battery sets in series and each battery set contains four 10 Ah batteries in parallel (a 2 kWh module). Lithium iron batteries are again used in the present case. In the battery module, two controllers are used in monitoring the 16 battery sets (8 channels each) being connected in series. The second voltage is set to be 2.8V and the first voltage (cut-off voltage) is set to 2.0V for each battery set. The system voltage is monitored and is set to be 48V for alarm. It is observed that if one of the battery sets is discharged 20% ahead of other battery sets, and the second voltage (2.8V) alarm is disabled, the 48V alarm may not sound before system shut down is triggered by the first voltage (2.0V, battery set cut-off voltage). This demonstrates the failure in using system voltage alone as the alarm. Since conventional UPS operates as: Alarm when system voltage is below 48V, shut down when system voltage is below 45V. It is thus ideal to combine other alarm generated by the second voltage for notifying users before system shuts down. If the continuous second voltage alarm sounds before the preset system voltage alarm (48V) is reached, the state of health of the battery set is determined as NG and "maintenance required" should be generated to attract the user's attention.

Note that alternate implementations may be included within the scope of the disclosure, in which functions may be executed out of order from that shown or discussed in association with FIGS. 2-3, including substantially concurrently or in reverse order, depending on the functionality involved, as would be understood by those reasonably skilled in the art.

It should be emphasized that the above-described embodiments of the present disclosure are merely possible examples of implementations, merely set forth for a clear understanding of the principles of the battery control system and method embodiments. Many variations and modifications may be made to the above-described embodiment(s) without departing substantially in spirit and principles. All such modifications and variations are intended to be included herein within the scope of this disclosure and protected by the following claims.

At least the following is claimed:

1. A battery control system, comprising:
a plurality of battery cells comprising a battery system; and
a controller coupled to the plurality of battery cells, the controller configured to monitor, for each battery cell, a first voltage and a second voltage, the first voltage corresponding to an absolute value of a shut-off voltage and a second voltage corresponding to a warning voltage, the first voltage smaller than the second voltage, wherein responsive to one of the battery cells reaching the second voltage, the controller is configured to provide a first alert before any of the battery cells reaches the first voltage, wherein the controller is further configured to cause an instruction to reduce a load responsive to the first alert, wherein if the reduction in load fails to stop the alert, the controller is further configured to monitor a state of health of the battery system, wherein responsive to a system voltage of the battery system not being attained, the controller abstains from issuing a second alert, otherwise, the controller is configured to provide a second alert.

2. The system of claim 1, wherein the controller is configured to provide the first and second alerts in the form of an audible, visible, or tactile event, or a combination of two or more of the audible, visible, and tactile events.

3. The system of claim 1, further comprising a second controller communicatively coupled to the controller and configured to monitor a system voltage, wherein the plurality of battery cells comprises one or more modules, the plurality of battery cells are configured in parallel and in series, wherein the second controller and the first controller are packaged in a single integrated device.

4. The system of claim 3, wherein the controller is further configured to cause an instruction to reduce a load responsive to the first alert, wherein if the reduction in load fails to stop the alert, the second controller is further configured to monitor a state of health of the battery system.

5. The system of claim 4, wherein responsive to the system voltage of the battery system not being attained, the controller or the second controller abstains from issuing a second alert, otherwise, the controller or the second controller is configured to provide a second alert.

6. The system of claim 5, wherein the controller or the second controller is configured to provide the first and second alerts in the form of an audible, visible, or tactile event, or a combination of two or more of the audible, visible, and tactile events.

7. The system of claim 5, wherein the second alert corresponds to a message that maintenance is required.

8. The system of claim 1, wherein each battery cell is lithium ion based.

9. A battery control method, comprising:
in a controller:
monitoring each battery cell among a plurality of battery cells of a battery system;
determining whether any of the battery cells is equal to a warning voltage, the warning voltage set for each battery cell above an absolute cut-off voltage;
responsive to one of the battery cells reaching the warning voltage, providing a first alert to reduce a load coupled to the plurality of battery cells before any of the plurality of battery cells reaches the absolute cut-off voltage; and
providing an instruction to reduce the load responsive to the first alert, wherein if the reduction in the load fails to stop the alert, monitoring a state of health of the battery system, wherein responsive to a system voltage of the battery system not being attained, abstaining from issuing a second alert, otherwise, providing the second alert.

10. The method of claim 9, wherein the first and second alerts are in the form of an audible, visible, or tactile event, or a combination of two or more of the audible, visible, and tactile events.

11. The method of claim 10, wherein the first alert comprises an instruction to reduce a load responsive to the first alert, wherein if the reduction in load fails to stop the alert, further comprising monitoring, in a second controller coupled to the controller, monitoring a state of health of the battery system.

12. The method of claim 11, wherein responsive to the system voltage of the battery system not being attained, abstaining from issuing a second alert, otherwise, providing the second alert.

13. The method of claim 12, wherein the first and second alerts are in the form of an audible, visible, or tactile event, or a combination of two or more of the audible, visible, and tactile events, and wherein the second alert corresponds to a message that maintenance is required.

14. A battery control system, comprising:
a plurality of battery modules coupled to a load, each battery module comprising battery units arranged in series and parallel configurations, the battery modules part of a battery system; and
a plurality of controllers in the battery system, each respectively coupled to the plurality of battery modules, the plurality of controllers configured to monitor, for each battery unit of each module, a first voltage and a second voltage, the first voltage corresponding to an absolute value of a shut-off voltage and the second voltage corresponding to a warning voltage, the first voltage smaller than the second voltage, wherein responsive to one of the battery units reaching the second voltage, one or more of the plurality of controllers is configured to provide a first alert before the any of the battery units reaches the first voltage, wherein the one or more of the plurality of controllers are further configured to cause an instruction to reduce the load responsive to the first alert, wherein if the reduction in the load fails to stop the alert, the one or more of the plurality of controllers are further configured to abstain from providing a second alert corresponding to a maintenance required message if the cumulative voltages of the plurality of battery modules is less than a preset system voltage of the battery system, wherein the plurality of controllers are contained in a single integrated device.

15. The battery control system of claim 14, wherein each battery unit comprises a battery cell.

16. The battery control system of claim 14, wherein each battery unit comprises a battery set.

* * * * *